United States Patent [19]
Sparks et al.

[11] Patent Number: 5,321,277
[45] Date of Patent: Jun. 14, 1994

[54] MULTI-CHIP MODULE TESTING

[75] Inventors: Steve E. Sparks, Plano; Darvin R. Edwards; Katherine G. Heinen, both of Dallas, all of Tex.

[73] Assignee: Texas Instruments Incorporated, Dallas, Tex.

[21] Appl. No.: 112,907

[22] Filed: Aug. 26, 1993

Related U.S. Application Data

[63] Continuation of Ser. No. 918,166, Jul. 21, 1992, abandoned, which is a continuation of Ser. No. 636,332, Dec. 31, 1990, abandoned.

[51] Int. Cl.[5] .................. H01L 23/48; H01L 23/46
[52] U.S. Cl. .................................. 257/48; 257/390; 371/22.3; 371/22.6; 365/200
[58] Field of Search ............... 357/71, 74; 371/221, 371/222, 223; 257/48, 390, 724; 365/200

[56] References Cited

U.S. PATENT DOCUMENTS

| | | | |
|---|---|---|---|
| 4,167,780 | 9/1979 | Hayashi | 364/200 |
| 4,504,784 | 3/1985 | Goel et al. | 324/73 |
| 4,509,008 | 4/1985 | DasGupta et al. | 324/73 |
| 4,817,093 | 3/1989 | Jacobs et al. | 371/25 |
| 4,847,800 | 7/1989 | Daane | 364/717 |
| 4,912,709 | 3/1990 | Teske et al. | 371/22.1 |
| 4,963,824 | 10/1990 | Hsieh et al. | 324/158 |
| 4,980,889 | 12/1990 | DeGuise et al. | 371/22.3 |
| 4,992,727 | 2/1991 | Simpson et al. | 324/158 |

OTHER PUBLICATIONS

Novellino, "Boundary Scan Holds Court at ITC '90", *Electronic Design*, Aug. 23, 1990, pp. 41–45.
Quinnell, "Adding Testability Also Aids Debugging", *EDN*, Aug. 2, 1990, pp. 67–74.
Tulloss and Yau, "Boundary Scan for Assembled Multi-chip Modules", AT&T Bell Laboratories, Engineering Research Center, publication date unknown.
Ellis & Bell, "Bottom–Up Techniques Propel Board Testability", *Electronic Design*, May 24, 1990, pp. 57–62.

*Primary Examiner*—Jerome Jackson
*Assistant Examiner*—Donald L. Monin, Jr.
*Attorney, Agent, or Firm*—Gary C. Honeycutt; Richard L. Donaldson; William E. Hiller

[57] ABSTRACT

A base for a multi-chip module that provides for built-in testability. Active test components are embedded in a module substrate. These test components primarily consist of boundary scan cells that comply with the IEEE 1149.1 test standard. The scan cells are connected to each other, and are connected to interconnection paths among chips and to individual chips, thereby partitioning the module into testable partitions. These partitions permit testing of chip interconnections, chip functionality, and module functionality. Scan cell connections may be mask programmable so that the same multi-chip module base can be used for many different multi-chip module configurations.

15 Claims, 3 Drawing Sheets

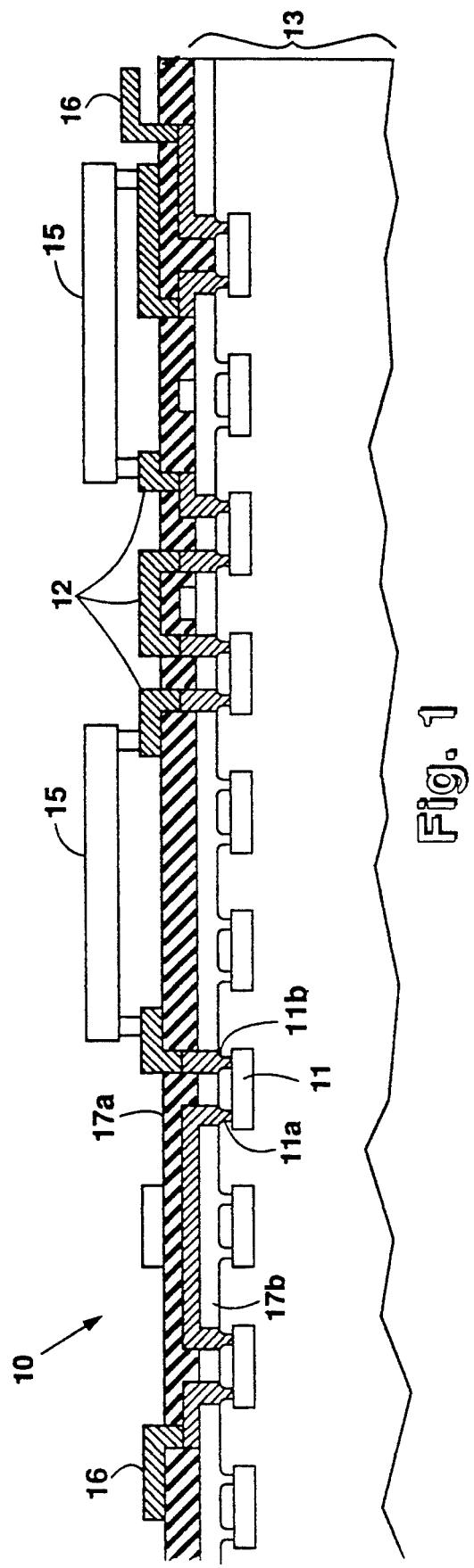

MULTI-CHIP MODULE TESTING

This application is a continuation of application Ser. No. 07/918,166, filed Jul. 21, 1992, now abandoned, which was a continuation of Ser. No. 07/636,332 filed on Dec. 31, 1990, now abandoned.

TECHNICAL FIELD OF THE INVENTION

This invention relates to testing electronic components, and more particularly to testing modules having more than one chip on a single substrate.

BACKGROUND OF THE INVENTION

Multi-chip modules are assemblies of two or more integrated circuits, capacitors, resistors, or other such devices, each connected to a single substrate. The chips are interconnected to implement a system function of the module. The chips on the module may be simple devices, such as transistors or diodes, or may be medium or large scale integrated circuits.

Although multi-chip modules have many advantages, such as reduced size, reduced signal path length, and convenience, they are difficult to test. The pin spacings among chips are close, often in the order of 0.010 inch or less. Also, the chips may be placed irregularly on the surface of the module. As a result, pin connections from the module to test equipment are difficult because of the large number of contact points, tight geometries, and randomness of contact placement. Testing the substrate connections before the chips are mounted is difficult because of the closeness and randomness of pin mount locations. Also, after chips are assembled onto the module, it is difficult to load test vectors for individual chips, unless extra test pads for each chip have been provided on the module. In short, the "bed of nails" approach to testing components of a printed circuit board is not practical for multi-chip modules.

Although "end to end" functional testing of multi-chip modules is available, this type of testing does not guarantee isolation of faults within a module. Several approaches have been used to isolate faults within a multi-chip module. One approach is to test individual chips by placing additional test components, such as boundary scan test devices, on the module. However, this approach defeats the purpose of multi-chip modules, which is to provide a dense and compact device. Another approach is to test chips by providing them chips with built-in test features. However, not all chips can be expected to have this feature. A need exists for a method of testing each chip on the module and the interconnections among them, as well as the entire module.

SUMMARY OF THE INVENTION

One aspect of the invention is a base for a multi-chip module, upon which a number of chips may be connected using an interconnection system of electrically conductive paths. A substrate comprised of a semiconductor material has a number of boundary scan cells embedded within it. Scan cell connectors are also embedded within the substrate, and are used to connect scan cells to each other. Also, scan cell input and output connectors connect scan cells to the chips or to points of the interconnection system. In this manner, the module is partitioned according to scan paths associated with individual chips or with segments of the interconnection system. These partitions may then be tested in accordance with boundary scan techniques.

A technical advantage of the invention is that the substrate interconnections before addition of chips, as well as the functionality of individual chips and of the entire system after assembly, may be tested. Incorporation of boundary scan partitions into a multi-chip module permits a structured test procedure of interconnections, chips, and chip integration. Errors may be detected during any one of three stages of chip assembly, i.e., interconnection fabrication, chip mounting, or overall assembly, which permits a failed module to be redesigned at the failing stage rather than later.

Other advantages are that test pin requirements are reduced to only four. Connections among scan cells in the chip base may be made mask programmable, which avoids the need for a custom chip base for each particular multi-chip module configuration.

BRIEF DESCRIPTION OF THE DRAWINGS

FIG. 1 is a cross sectional view of a multi-chip module, having active test devices embedded in the substrate in accordance with the invention.

DETAILED DESCRIPTION OF THE INVENTION

Figure 2A:
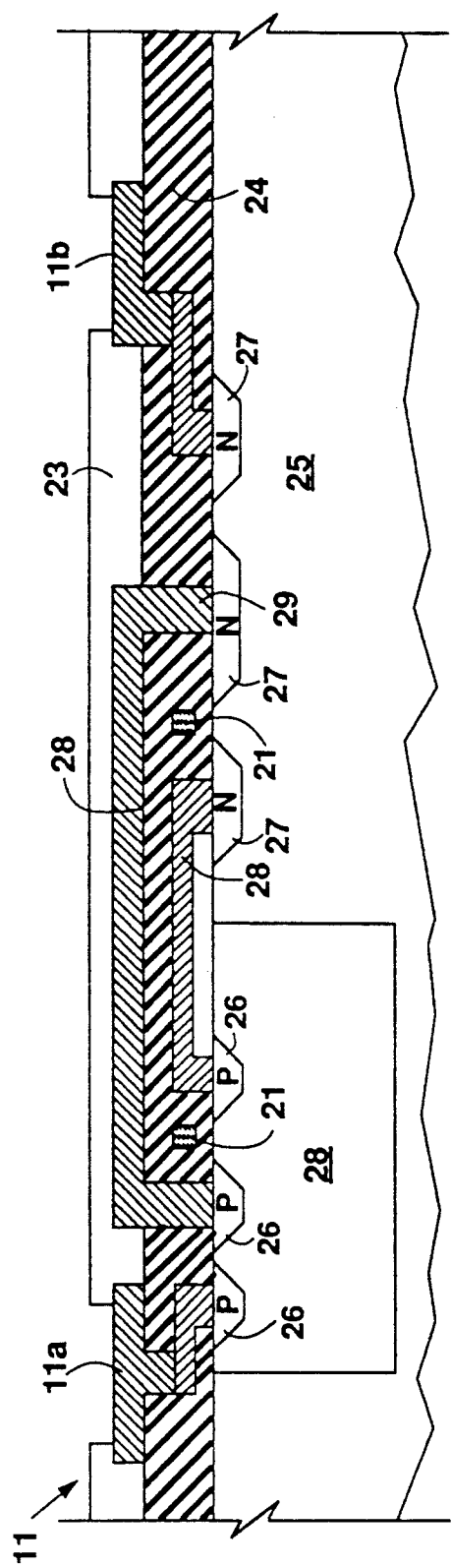
FIG. 2A illustrates process levels of a typical scan cell embedded in a chip base.

FIG. 1 is a cross sectional view of a multi-chip module 10, having boundary scan cells 11 in accordance with the invention. The "functional elements" of module 10 include interconnect system 12 and chips 15, as distinguished from the "test elements", such as scan cells 11. Interconnection system 12 is located at the surface of a chip base 13. A number of chips 15 are attached to predetermined points of interconnection system 12. The connections between chips 15 and interconnection system 12 are accomplished by known means, such as wire bonding, tape automated bonding leads, or flip-chip bump interconnection.

Dielectric layers 17a and 17b provide insulation between paths of interconnection system 12. Although FIG. 1 shows two dielectric layers 17a and 17b, with an associated layer of interconnection system 12 and a layer of scan cells 11, additional layers of interconnects and dielectric are possible.

Interconnection system 12 is a network of routing paths that electrically connect chips 15 to each other and to scan cells 11. Also, input and output pins 16 of module 10 are connected to interconnection system 12. Interconnection system 12 can be made by known means, such as by fabricating conductive signal paths on dielectric layers 17a and 17b, using lithographic means.

Chip base 13 differs from a typical chip substrate in that a number of boundary scan cells 11 are embedded within it. Boundary scan cells are consistent with the boundary scan interface standard, known as the IEEE 1149.1 standard. This standard embodies a design for test methodology in which a partitioning scan ring is formed at the perimeter of a segment of functional logic to provide the ability to control and observe the logic via scan operations. Typically, the logic that is partitioned with a scan ring in this manner are devices on a printed circuit board.

Scan cells 11 are scannable registers, one associated with each pin of a chip 15, except for Vcc and Gnd pins.

During normal, i.e., non-test, operation of module 10, scan cells 11 are transparent. However, in test mode, scan cells 11 permit users to control and observe data on the pins. Each scan cell 11 has an input connector 11a and an output connector 11b for connecting the scan cell 11 to a selected pin of a chip 15 or to a point on interconnection system 12.

Functionally and structurally, each scan cell 11 complies with the 1149.1 standard. Thus, scan cells 11 may have a number of different configurations, ranging in functionality from simple controllability/observability cells to more complex cells used for built-in self test applications. However, all scan cells 11 offer the ability to control and observe a node at the same time. The simplest forms have at least one latch, and more typically, have two latches and two multiplexers. As an example of the functionality of the latter, the two multiplexers select between test data and normal data. The first latch captures the state of the data line while loading the second latch with the data it previously held.

FIG. 2A illustrates typical process levels of a scan cell 11. Scan cells 11 are fabricated within chip base 13 by means of any one of a number of well known techniques. The layers of FIG. 2A are typical of a standard CMOS fabrication process, and the number of transistor elements is for purposes of example only.

Polysilicon elements 21 are used as gates for transistors and as interconnect elements. A passivation layer 23 provides electrical stability by isolating active devices from external conditions. Layers of oxide/dielectric material 24 provide a body for connection paths between active regions of the scan cell Substrate 25 is made from silicon or other semiconductor material, and in the embodiment of FIG. 2A, is a P-type material. P-type regions 26 and N-type regions 27 are embedded in substrate 25, with an N-type tank 28 surrounding P-type regions 26. Thus, N-type transistors are formed directly on P-type substrate 25, and P-type transistors are formed in the N tank 28. Cell connection paths 29 connect P-type regions 26 to N-type regions 27 and to input connector 11a and output connector 11b.

Figure 2B:
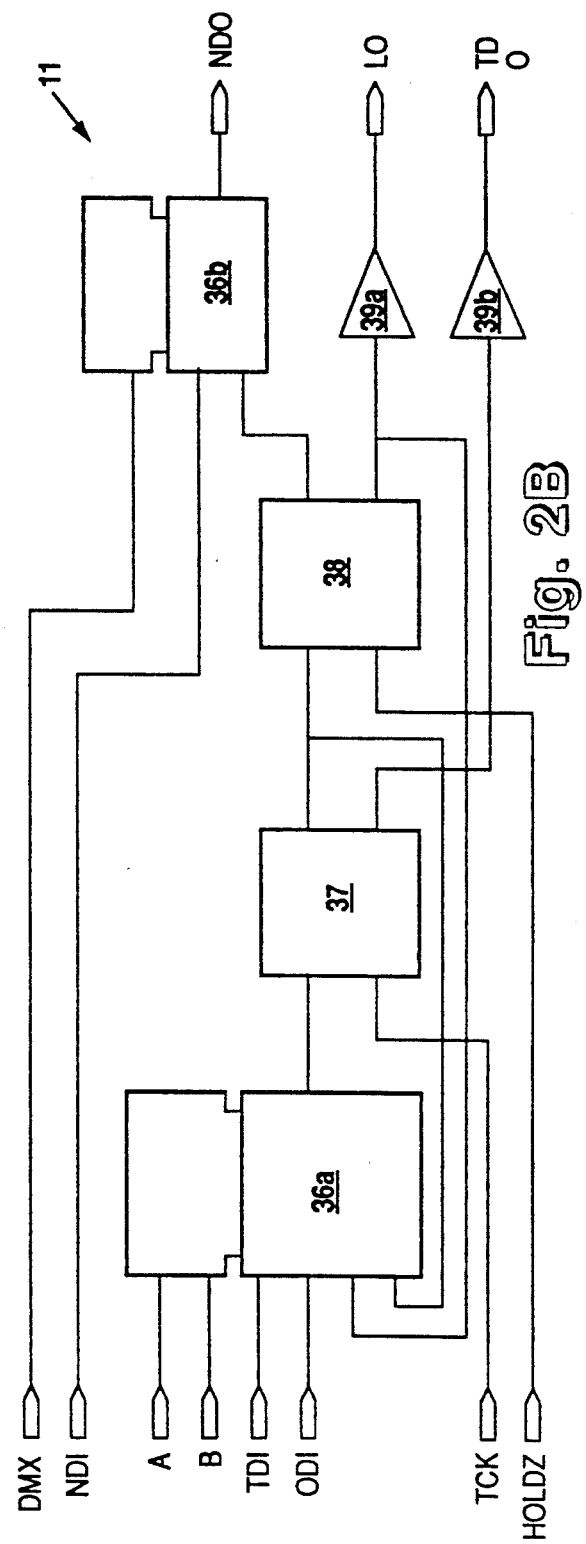
FIG. 2B is a block diagram of a typical scan cell 11.

FIG. 2B is a block diagram of a typical scan cell 11, such as might be realized with the fabrication illustrated in FIG. 2A. Scan cell 11 has two multiplexers 36a and 36b, a flip-flop 37, a latch 38, and two inverters 39a and 39b. In the preferred embodiment, flip-flop 37 and latch 38 are D type devices. A Normal Data IN (NDI) line carries non test data to multiplexer 36b, which selects a Normal Data Out (NDO) line. Inputs A and B to multiplexer 36a are multiplexer select inputs, which include Test Data In (TDI), Observer Data In (ODI), registered shift data, and latched output data. TCK is a timing signal to flip-flop 37. HOLDZ is a clock signal to latch 38. LQ is latch data output, as is Test Data Out (TDO). The flip-flop 37 captures data and performs TDI to TDO shifting operation. Latch 38 takes the TDI data and drives it onto the normal data path. These functions of flip-flop 37 and latch 38 are the two basic boundary scan cell functions: observability and controllability. The TDI, TDO, and TCK lines are further explained below in connection with FIG. 3.

Figure 3:
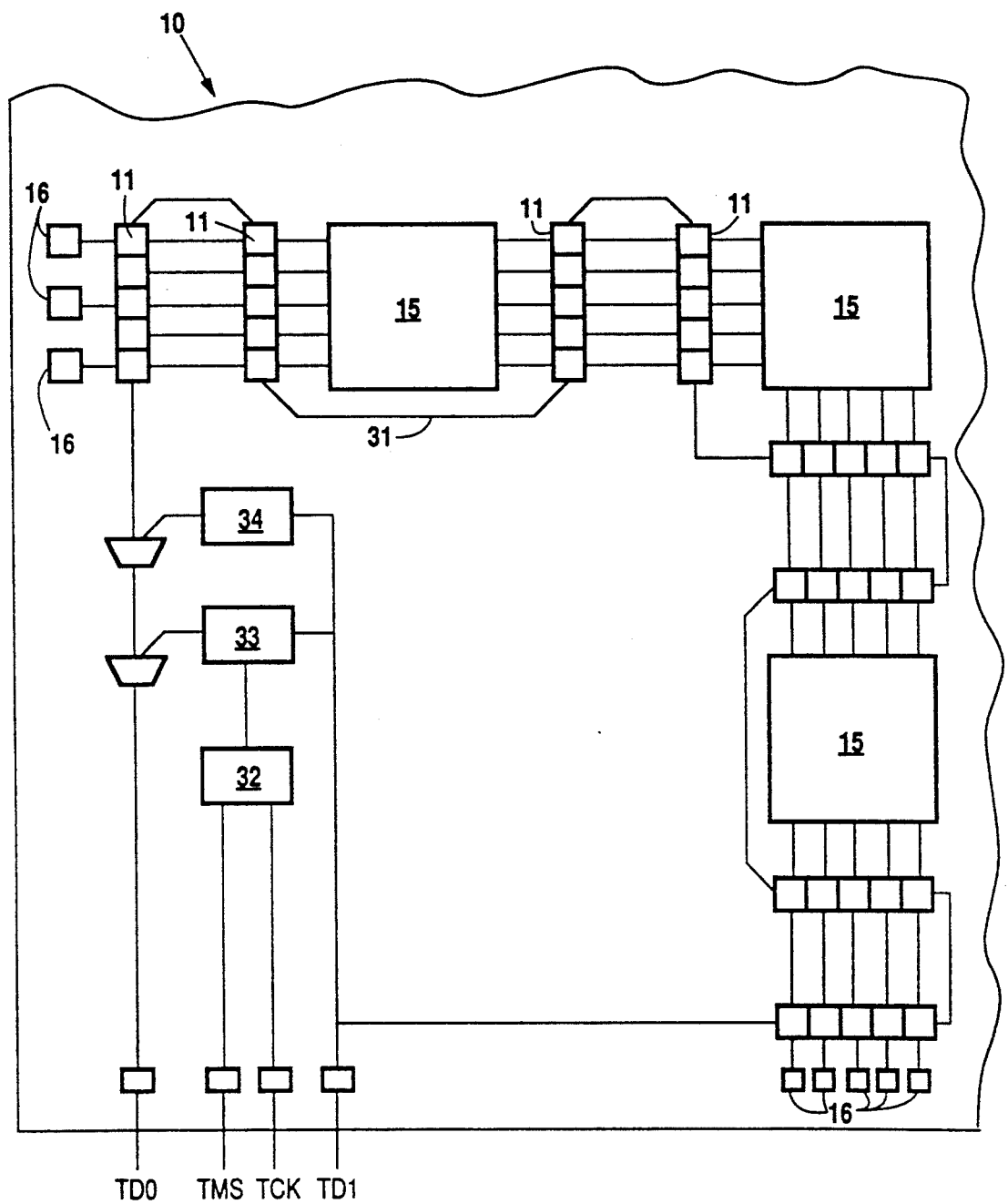
FIG. 3 is a block diagram of a multi-chip module.

FIG. 3 is a block diagram of a portion of a multi-chip module. FIG. 3 is "expanded" in the sense that chips 15 and scan cells 11 are actually on different layers of module 10, as shown in FIG. 1. In the preferred embodiment, scan cells 11 are placed in scan cell register banks, with the number of scan cells 11 in each bank being appropriate for the number of pins on a side of a chip 15. Segments of interconnection system 12 are isolated and tested if appropriately placed scan cells 11 are interposed at selected start and end points of signal paths.

FIG. 3 illustrates key features of the boundary scan standard in addition to scan cells 11: a four-wire serial data/control bus 31, a Test Access Port (TAP) controller 32, an instruction register 33, and a bypass register 34. Bus 31 connects scan cells 11 to each other. The four lines of bus 31 provide the test data and control input and output to and from module 10 and chips 15. A Test Data Input (TDI) line is used to load serial data into the 1149.1 logic. A Test Data Output (TDO) line is used to unload serial data from the 1149.1 logic. The other two lines are described below in connection with TAP controller 32. Each scan cell 11 also has a Normal Data Input (NDI) and a Normal Data Output (NDI) line, which are used during normal operation.

Scan cells 11 are daisy chained to form one or more serial scan paths. By connecting a TDO line of one scan cell 11 to a TDI line of a next scan cell 11, a number of scan cells 11 associated with a chip 15, or with a segment of interconnection system 12, are linked. Linked scan cells 11 are placed at both ends of interconnection paths between chips 15, as well as around the boundary of each chip 15.

The linked scan cells 11 create a partition of that chip 15 or segment of interconnection system 12. In this manner, module 10 is partitioned according to segments of interconnection system 12 and to chips 15, and each of these partitions is associated with a scan path. For purposes of description herein, a chip 15 or a segment of interconnection system 12 that is partitioned in this manner is referred to as a "partition".

For testing a partition, test data is input to a primary TDI line of the partition, and data is read out from a primary TDO line. For testing the module, the primary TDO line of one partition is connected to the primary TDI of a next partition until all partitions to be tested are linked. Each input and output pin 16 of module 10 is also connected to a scan cell 11.

As explained below, connections among scan cells 11 may be specifically designed for a particular configuration of chips 15. Alternatively, connections may be mask programmed from an array of available connections, for a specific layout of chips 15 on a module 10.

Test Access Port (TAP) controller 32 controls the boundary scan protocol and the sequencing of scan cells 11. It generates 1149.1 test logic control signals. In the preferred embodiment, TAP controller 32 is a finite state machine having 16 states. A Test Mode Select (TMS) line into TAP controller 32 controls execution of 1149.1 instructions. A Test Clock (TCK) is a clock input line used to clock test memory logic. A succession of TMS values moves TAP controller 32 through its states.

Instruction register 33 and bypass register 34 are also embedded within substrate 25. These registers are consistent with the 1149.1 standard. Instruction register 33 stores 1149.1 commands that provide the address and control signals required to access a particular scan path. In the preferred embodiment, instruction register 33 has a separate path in parallel between the primary TDI pin and TDO pin of each partitioned chip or segment of interconnection system 12. This permits TAP controller 32 to select and shift data through one of the scan paths, instruction or data, without disturbing the other scan path.

Bypass register 34 is used when access to scan cells 11 is not required or when scan path lengths are to be reduced. Thus, the bypass register 34 permits abbreviation of a scan path of a partition not being tested. As shown in FIG. 3, a single bypass register 34 may be used to bypass the scan path. Alternatively, a master bypass register 34 may be used in conjunction with an additional bypass register 34 for each chip 15, which permits independent bypassing of each chip 15.

In the preferred embodiment, all active test devices, such as scan cells 11 and TAP controller 32, are designed in accordance with the System Controllability, Observability, and Partitioning Environment (SCOPE) test protocol developed by Texas Instruments, Incorporated. The SCOPE protocol is consistent with the IEEE 1149.1 standard, and is a hardware and software system designed for board testing.

A feature of the invention is that connections among scan cells 11 may be made mask programmable, such that the connections among scan cells 11, and the connections to interconnection system 12 and chips 15, are determined according to a particular configuration of a module 10. The mask programming may be accomplished by any one of a number of known means, such as by fuse or metallization techniques. A "sea of cells" approach may be used to fabricate a wafer from which a number of chip bases 13 are cut. Each wafer contains arrays of scan cells 11, similar to gate arrays, which are interconnected by programming them with masks unique to a particular substrate design. A standard wafer can therefore be used to fabricate a number of substrates.

During scan testing, test vectors are loaded using a standard computer, and are input serially into scan cells 11. Although the testing is not at operational speeds, the testing does permit functionality testing, which is adequate for most fault isolation of multi-chip modules 10. The test vectors are a series of input stimuli values that are applied at the beginning of a period of time and a set of output observation values made at the end of a period of time, which are represented by a string of values. The order position corresponds to a specified pin order.

Operation of the invention may involve several different types of testing. The interconnection system 12 on chip base 13 may be tested before chips 15 are connected, for continuity and shorts. After assembly, individual chips 15 may be tested. Module 10 may be tested to determine overall system functionality.

To isolate interconnection faults, interconnection testing is accomplished by loading test vectors into scan cells 11 on one side of module 10. Scan cells on another side of module 10 read out the data. In other words, a scan cell 11 at one end of a partition of interconnection system 12 is configured as a driver and a scan cell 11 at the other end is configured as a receiver. Driver/receiver pairs are implemented for each partition to be tested. Continuity defects and shorts are indicated by data errors, i.e., high values that should be low and vice versa. For example, for continuity testing, the data in should match the data out. Similarly, shorts between paths can be detected by scanning in complementary values to the nodes driving the paths, and comparing the output values.

To isolate chip faults, after assembly of module 10, individual chips 15 are tested, using standard 1149.1 protocols. A separate test is performed for each chip 15, one after the other. Once a chip 15 is placed on chip base 13, the scan cells 11 associated with that chip 15 are enabled to isolate it from the rest of the chips 15 on the module 10. Test vectors are applied and received via the TDI and TDO paths. The isolation capability for individual chips 15 is a feature of the 1149.1 standard and permits off-chip signal activity from interfering with the testing of the chip 15 being tested.

To isolate chip integration faults, an assembled module 10 may be tested by using the package pins of module 10 and performing a functional test, or by using the four pins of test bus 31 and performing a scan test. The scan test is simplified because the tests for individual chips 15 may be concatenated.

Although the invention has been described with reference to specific embodiments, this description is not meant to be construed in a limiting sense. Various modifications of the disclosed embodiments, as well as alternative embodiments will be apparent to persons skilled in the art. It is, therefore, contemplated that the appended claims will cover all modifications that fall within the true scope of the invention.

What is claimed is:

1. A multi-chip module base, upon which a number of chips and other functional elements are to be interconnected, comprising:

a substrate comprised of a semiconductor material; an array of substantially identical boundary scan test circuits embedded within said substrate;

input and output connectors in said substrate for connecting said test circuits to selected points of functional elements of said module; and connectors embedded within said substrate inter-connecting said test circuits to each other in a configuration that permits simultaneous pre-testing of all the test circuits in the substrate prior to mounting module chips, and to said input and output connectors in accordance with boundary scan techniques.

2. The multi-chip module substrate of claim 1, including mask programmable means for selectively interconnecting a number of said test circuits with each other, and for selectively connecting said selected input and output connectors, such that the module base is configured to match a selected set of module chips.

3. The multi-chip module base of claim 1, further comprising an interconnection system, for connecting said chips, fabricated onto said base.

4. The multi-chip module base of claim 1, wherein said input and output connectors are accessible at the surface of said base.

5. The multi-chip module base of claim 1, and further comprising a test access port controller embedded in said substrate.

6. The multi-chip module base of claim 1, wherein said test circuits are fabricated in accordance with standard transistor fabrication layers.

7. The multi-chip module base of claim 1, wherein each of said test circuits has a passivation layer, a dielectric layer, and N-type and P-type regions, and has said scan cell connectors embedded within said dielectric layer.

8. The multi-chip module base of claim 1, wherein said connectors are part of a boundary scan bus.

9. The multi-chip module base of claim 1, wherein a selected boundary scan test circuit is configured as a driver, and another selected test circuit is configured as a receiver, so that the substrate system may be self-tested prior to mounting module chips thereon.

10. A multi-chip module, comprising:

a substrate, as defined in claim 1, said substrate further including and circuit connectors embedded within said substrate connecting said test circuits to each other to form a scan path;

a number of chips attached to said substrate, wherein one or more of said chips is connected to said scan path by connecting pins of said chip to said test circuits; and an interconnection layer for interconnecting said chips, said interconnection layer also having connections to said scan path at selected points.

11. The multi-chip module of claim 10, wherein said substrate is mask-programmable, to select the test circuit interconnections that are required for testing a selected chip set.

12. The multi-chip module of claim 10, wherein said substrate further comprises at least one test access port controller, instruction register, and bypass register.

13. The multi-chip module of claim 10, further comprising a boundary scan bus embedded within said substrate.

14. The multi-chip module of claim 10, further including mask-programmable means for selectively interconnecting a number of said test circuits with each other, and for selectively connecting said selected test circuits with selected input and output connectors, such that the substrate system is configured to match a particular module chip set.

15. The multi-chip module of claim 10, wherein a selected test circuit is configured as a driver, and another selected test circuit is configured as a receiver, so that the substrate system may be tested independently of the module chip set.

* * * * *